United States Patent [19]

Hugues et al.

[11] Patent Number: 4,770,590
[45] Date of Patent: Sep. 13, 1988

[54] METHOD AND APPARATUS FOR TRANSFERRING WAFERS BETWEEN CASSETTES AND A BOAT

[75] Inventors: Jean B. Hugues, Tempe, Ariz.; Lynn Weber, Saratoga; James E. Herlinger, Palo Alto, both of Calif.; Katsuhito Nishikawa, San Jose, Calif.; Donald L. Schuman, Saratoga, Calif.; Gary W. Yee, Santa Clara, Calif.

[73] Assignee: Silicon Valley Group, Inc., San Jose, Calif.

[21] Appl. No.: 864,077

[22] Filed: May 16, 1986

[51] Int. Cl.⁴ .................. B23K 9/00; C23C 15/00
[52] U.S. Cl. .................. 414/172; 198/395; 198/464.3; 250/561; 414/225; 414/331; 414/416; 414/744 B; 414/786; 901/17; 901/47; 29/407; 29/759
[58] Field of Search .......... 414/172, 222, 223, 225, 414/331, 416, 47, 744 B, 752, 627, 786; 901/6, 7, 33, 35, 45, 17, 40, 46, 47; 250/222.1, 561; 29/703, 705, 709, 712, 729, 759, 407; 198/346.1, 395, 464.3

[56] References Cited

U.S. PATENT DOCUMENTS

| | | | |
|---|---|---|---|
| 3,834,555 | 9/1974 | Bennington et al. | 414/627 |
| 3,874,525 | 4/1975 | Hassan et al. | 414/225 |
| 4,432,685 | 2/1984 | Stauber | 414/47 X |
| 4,451,191 | 5/1984 | Torre | 414/47 X |
| 4,457,664 | 7/1984 | Judell et al. | 414/754 X |
| 4,501,527 | 2/1985 | Jacoby et al. | 414/225 |
| 4,502,829 | 3/1985 | St. Cyr | 29/703 X |
| 4,527,936 | 7/1985 | Hartlieb | 414/47 |
| 4,550,239 | 10/1985 | Uehara et al. | 414/331 X |
| 4,598,456 | 7/1986 | McConnell | 901/47 X |

FOREIGN PATENT DOCUMENTS

| | | |
|---|---|---|
| 3502359 | 8/1985 | Fed. Rep. of Germany ...... 414/331 |
| 3447728 | 6/1986 | Fed. Rep. of Germany ...... 901/46 |

Primary Examiner—Robert J. Spar
Assistant Examiner—Stuart J. Millman
Attorney, Agent, or Firm—Donald C. Feix

[57] ABSTRACT

A wafer transfer mechanism used for transferring wafers between cassettes and a boat uses sensors to detect and to measure any offset of the actual center of each wafer being transferred with respect to the expected or precalibrated center of that wafer. An appropriate adjustment is made to effectively eliminate such offset so that each wafer can be transferred throughout the system without any edge contact between a wafer and the boat or the cassette. The system also includes a boat exchange unit having a rotatable turntable which is used in association with two boats. The boat exchange unit permits a continuous mode operation in which one boat can be undergoing a loading or unloading of wafers at one station on the turntable while another boat is at or is moving to or from a heating chamber loading or unloading station on the turntable.

21 Claims, 5 Drawing Sheets

METHOD AND APPARATUS FOR TRANSFERRING WAFERS BETWEEN CASSETTES AND A BOAT

BACKGROUND OF THE INVENTION

This invention relates to methods and apparatus for transferring wafers of the kind used in the manufacture of semiconductors between cassettes and a wafer carrier boat of the kind used in a furnace.

This invention relates also to methods and apparatus for loading and unloading a boat into and out of a vertical furnace.

Wafers are made of a substrate material (e.g. silicon) which is relatively brittle. The boat used for supporting the wafers within a heating and/or processing chamber of a furnace is also usually made of a material (e.g. quartz) which is relatively brittle. And the coatings on the wafers and the boat are often brittle enough to be rather easily fractured. All of these materials are therefore subject to chipping or flaking if an edge of a wafer hits a cassette or boat in the course of transferring the wafer between a cassette and a boat.

The transfer of wafers between a boat and a cassette must be done with great precision in order to avoid any chipping or flaking contact between an edge of the wafer and a cassette or a boat.

If any such contact is made, and if any material is chipped or flaked off of a wafer or a boat, the electrical circuits on the wafer can be damaged. The circuits are densely packed together and have conductivity lines or paths which are of such extremely small size that any foreign material, such as particles of silicon, quartz or coatings, cannot be tolerated.

The wafers which are to be loaded in the boat and heated in the furnace are supplied to the furnace loading system stacked in slots in cassettes. The wafers must be transferred from these cassettes to the boat prior to the placing of the boat in the heating chamber of the furnace, and the wafers must be removed from the boat and returned to cassettes after the wafers have been subjected to a heating and/or processing cycle in the furnace.

In transferring a wafer between a cassette and a boat it is desirable that the transfer be done by an automated mechanism which can operate in a clean environment without manual intervention.

It is also generally desirable that a single boat be large enough to handle the contents of a number of cassettes, because a substantial amount of time is usually required for each process cycle. Processing more wafers at one time increases the production rate.

In order to be able to load a relatively large number of wafers from a number of different cassettes into a single boat, the loading mechanism has to be able to move a wafer vertically, radially and in a circular arc in the course of picking up a wafer from a source (a cassette or the boat) and transferring the wafer to a destination (a boat or a cassette).

The mechanism for transferring the wafer must therefore be precise in its construction and operation.

It must also be able to accommodate the variations or differences in the actual positions of wafer centers from the expected or the calibrated positions of wafer centers resulting from dimensional tolerances that are inherent in the system. This variation or offset of wafers centers must be determined and effectively corrected if the unacceptable edge contact between the wafers and the boat and cassettes is to be eliminated during the transfer operations.

SUMMARY OF THE INVENTION

It is an important object of the present invention to move a wafer throughout a wafer transfer mechanism of the kind referred to above without any contact of the edges of the wafer with the boat or the cassette.

It is a related object to eliminate the effect of inconsistent wafer handling due to variations in the outside diameter of a wafer being transferred. This object is accomplished by looking at both edge boundaries across a circular arc of a wafer during the course of a transfer of the wafer between a source and a destination in the system. The effect of variations in the outer diameter of a wafer is then eliminated by measuring the actual offset of the center of the wafer with respect to the center of a paddle carrying the wafer, and the paddle is repositioned by the lateral amount (or angular rotation) necessary to compensate for this measured offset. This puts the wafer, and not the paddle, on the true center location required for subsequent transfer of the wafer to the destination.

Mechanical displacement errors will occur when a wafer is picked up by a paddle due to system variations and wafer diameter variations. By measuring the actual offset, the center of the wafer relative to the center of the paddle can be determined. The paddle is then repositioned by the lateral amount (or angular rotation) necessary to compensate for this measured/calibration offset. This eliminates all errors introduced during wafer pick-up and allows the system to conserve all of the available tolerances for the very critical wafer delivery; and this is an important object of the present invention.

It is another object of the present invention to use a turntable and two boats in a boat exchange mechanism in a way such that one boat can be undergoing a wafer loading/unloading operation at one wafer loading station while the other boat is supportable on the turntable at a processing chamber loading/unloading station. The boats are transferred between the wafer loading/unloading station and the processing chamber loading/unloading station by rotation of the turntable.

In one specific embodiment of the present invention, a furnace system for heating and/or processing wafers comprises a wafer transfer module which is constructed to position a number of cassettes and a boat near a wafer transfer mechanism. The cassettes hold individual wafers in individual slots in the cassettes, and the boat has a number of slots for holding wafers to be processed when the boat is loaded in a processing chamber.

The boat is held in an upright position at a wafer loading/unloading station while wafers are transferred between the slots of the cassette and the slots of the boat. The wafer transfer mechanism has a paddle which picks up an individual wafer at a source (a cassette or the boat) and carries the wafer to a destination (the boat or a cassette). The wafer is held on the paddle by a vacuum system having openings in the upper surface of the paddle which are covered or closed by the underside of the wafer. The paddle is movable vertically to pick-up and to deposit a wafer. It is also movable radially into and out of a cassette and into and out of the boat. The paddle is also movable in a circular arc in the course of making a transfer.

The wafer transfer mechanism includes vertical, radial and rotational motor drives for moving the paddle in the respective vertical, radial and rotational directions.

A controller controls the actuation of the vertical, radial and rotational motors.

The wafer transfer mechanism includes a radial sensor for sensing the amount of radial movement of the paddle which is involved in withdrawing a wafer from a cassette or from the boat.

The vacuum system of the paddle provides a vertical sensor signal for sensing the vertical position of a wafer in a slot in a boat or a cassette (in addition to holding the wafer on the paddle as described above).

A theta sensor is also used to sense and to measure the amount of any offset of the center of the paddle with respect to the center of a wafer carried on the paddle.

The three sensors are operatively associated with the controller for establishing (by a calibration routine performed in three coordinates) the expected center of a wafer in each cassette slot and in each boat slot.

The theta sensor is also operatively associated with the controller to detect and to compensate for any lateral offset of the paddle center with respect to the wafer center as might occur during the actual transfer of a wafer. The controller repositions the paddle laterally by the amount of rotation required to eliminate the offset so that each wafer can be delivered to a slot location with the actual center of the wafer, and not the paddle, on the true center location required for the subsequent transfer of the wafer to the destination. The wafer therefore goes into the slot with the desired clearances between the edges of the wafer and the edges of the slot.

The center line of the wafer is determined by looking at two opposite edges of each wafer on the paddle.

If this center line of the wafer is offset from the center line of the paddle, the controller repositions the paddle to compensate for the amount of the offset.

Finding the location of both edges permits the wafer transfer mechanism to move the wafer with reference to the actual location of the wafer in the transfer mechanism rather than with reference to the uncorrected position of the paddle.

This in turn effectively eliminates the large variations in the location of the side edges of the wafer, which variations are otherwise inherent in the wafer transfer system.

By locating the true center of the wafer on the paddle, the wafer transfer systems can then insert each wafer into its destination with high precision and without any contact of the edges of the wafer with the structure of the destination.

Wafer transfer apparatus and methods which incorporate the features described above and which are effective to function as described above constitute further, specific objects of this invention.

Other and further objects of the present invention will be apparent from the following description and claims and are illustrated in the accompanying drawings which, by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

DETAILED DESCRIPTION OF THE PREFERRED EMBODIMENTS

Figure 1:
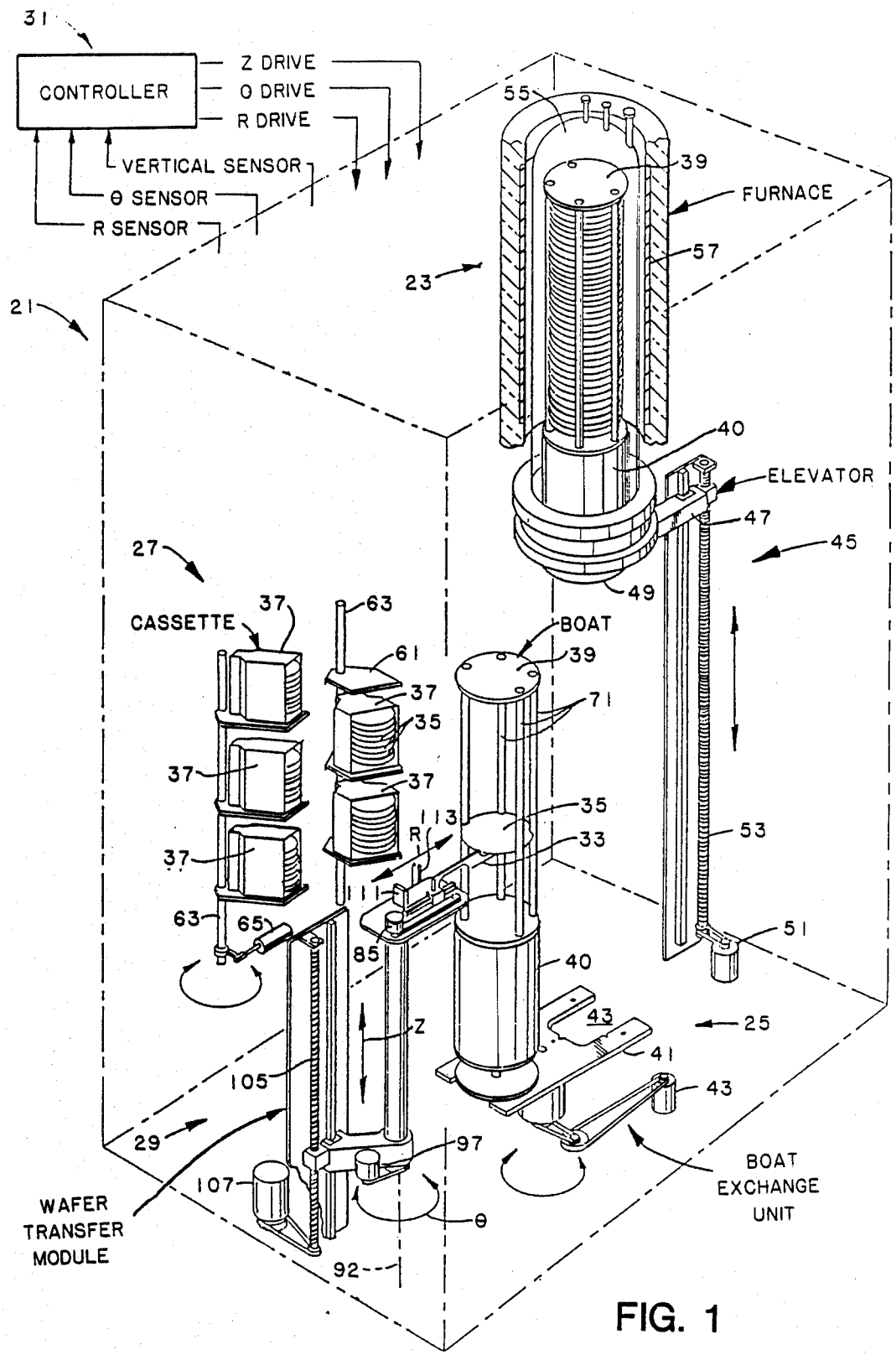
FIG. 1 is an isometric view, partly broken away to show details of construction, of a furnace system constructed in accordance with one embodiment of the present invention.

A furnace system constructed in accordance with one embodiment of the present invention is indicated generally by the reference numeral 21 in FIG. 1.

The furnace system 21 comprises a vertical furnace 23, a boat exchange unit 25, a cassette holder system 27, a wafer transfer module mechanism 29, and a controller 31.

Figure 2:
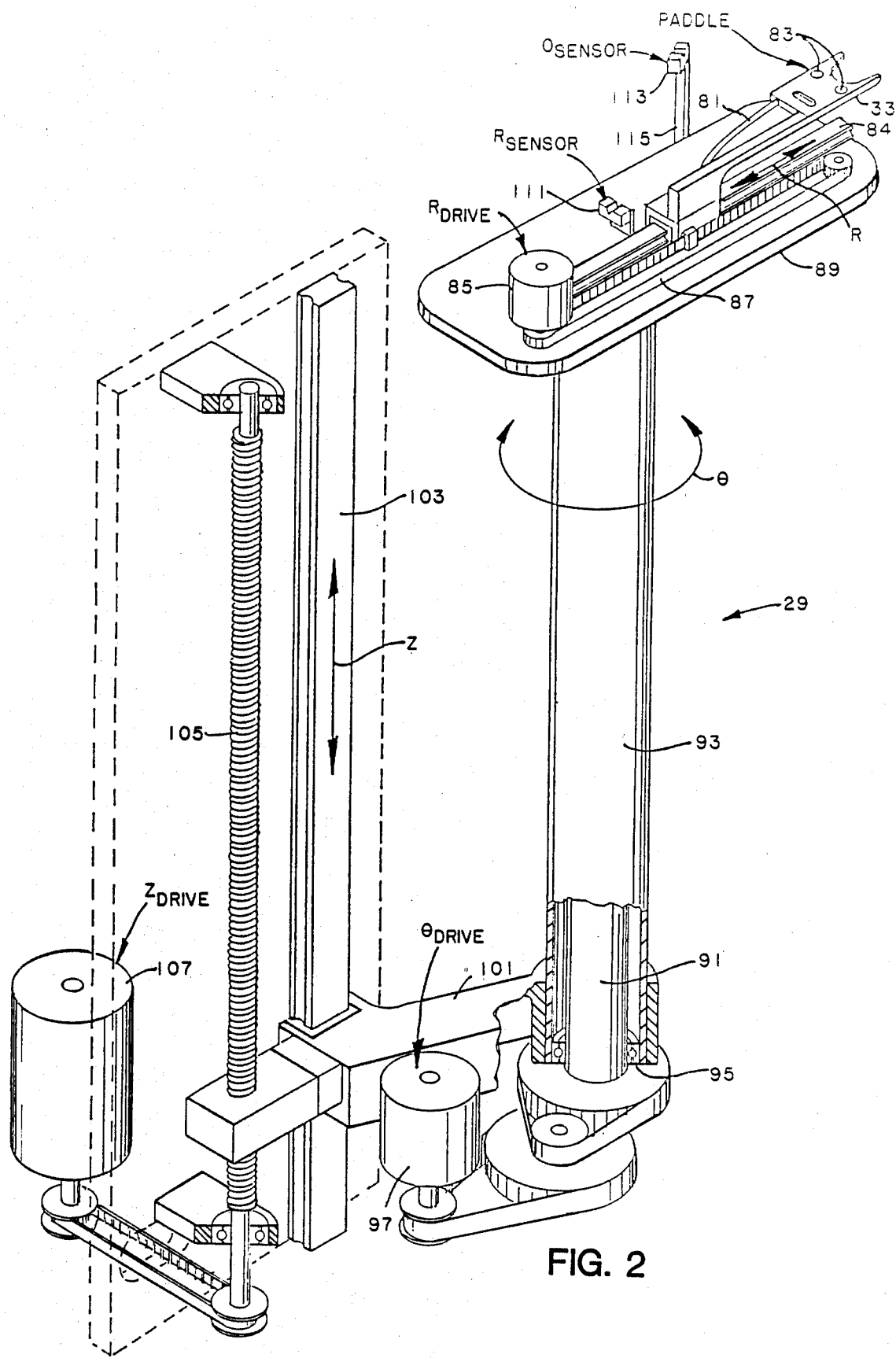
FIG. 2 is an isometric view, partly broken away to show details of construction, of the wafer transfer module mechanism of the furnace system of FIG. 1.

The construction of the wafer transfer module mechanism 29 is shown in more detail in FIG. 2.

The wafer transfer module mechanism includes a paddle 33 which is used to pick and to carry a wafer 35 in the course of transferring the wafer between a slot in a cassette 37 and a slot in a boat 39, as will be described in more detail below.

In picking up and carrying a wafer 35 in the course of such a transfer, the paddle 33 is movable in a vertical (Z) direction and in a radial (R) direction and in a rotational (theta) direction as indicated by the respective Z, R and theta letters in FIG. 1.

The wafer transfer module mechanism 29 is used to transfer wafers both from the cassettes 37 to the boat 39 and from the boat 39 to the cassettes 37. Wafers are transferred from the cassettes to the boat when the boat is being loaded with wafers to be heated in the vertical furnace 23. Wafers are transferred from the boat 39 back to cassettes 37 after the wafers have undergone a heating and/or processing cycle in the vertical furnace 23.

In FIG. 1 the boat 39 is shown in a wafer loading/unloading station. The boat 39 is supported at this station on a pedestal 40 by a turntable 41, and the turntable is rotatable (by means of a drive motor 43 and associated pulleys and drive belts) to transfer a boat 39 loaded with wafers through 180 degrees (as indicated by the block arrow in FIG. 1) to a chamber loading/unloading station (indicated by the arrow 43 in FIG. 1) directly in line with the vertical furnace 23.

An elevator 45 includes a lift arm 47 which engages a lower flange 49 of a pedestal support for the boat 39 at the chamber load/unload station 43 and lifts the boat 39 through a door into the lower end of the vertical furnace 23 as illustrated in FIG. 1. The elevator 45 includes an elevator drive motor 51 and rotatable lift screw 53 for raising and lowering the lift arm 47.

The vertical furnace 23 comprises, in the embodiment shown in FIG. 1, an internal heating chamber formed within an axially elongated, generally tube shaped member 55. This member 55 is, in the embodiment shown in FIG. 1, made of quartz.

Furnace elements 57 provide thermal heating of the heating chamber and the wafers 35 which are carried within the slots of the boat 39 within the heating chamber.

At the end of the heating, the elevator 45 lowers the boat 39 from the vertical furnace 23 back down to the chamber loading/unloading station 43 on the turntable 41.

The boat exchange mechanism 25 thus permits a continuous mode operation in which one boat 39 can be unloaded and loaded with wafers 35 while another boat 39 is undergoing heating in the vertical furnace 23.

In a specific embodiment of the present invention the boat 39 is also made of quartz.

As noted above, quartz and the coatings or deposits on the quartz are relatively easily chipped or flaked if hit by an edge of a wafer 35. And the silicon wafer and its coating are easily fractured if the edge of a wafer hits the boat or a cassette.

Because of the small size and precision of the electronic circuits formed on the wafers 35, any foreign material (such as particles of quartz, silicon, or coatings) can cause problems with obtaining the desired yield of good circuits; and the occurrence of such particulates must therefore be avoided.

The problem of avoiding unwanted contact between the edge of the wafer 35 and the sides of the wafer supporting slots in the cassettes or the quartz boat 39 is a significant problem because of the system tolerances that are involved in making the transfers of wafers between the cassettes 37 and the boat 39. The tolerances can result in the actual center of a wafer in a particular source being offset from the expected or calibrated center of a wafer at that particular source. The amount of the offset can be enough to cause the edge of a wafer to hit the edge of a destination if this offset is not detected and effectively eliminated by an appropriate adjustment of the paddle position in the course of transferring that wafer from it source to its destination.

As noted above, the paddle 33 is movable in three coordinate directions for each wafer transfer.

As illustrated in FIG. 1, the wafers 35 to be loaded into a boat 39 prior to heating in the furnace 23 are contained in a number of cassettes 37 of a cassette holder system 27. Each cassette 37 is supported on a related cassette support shelf 61. A number of shelves 61 are supported by a related rod 63. Each rod 63 can be rotated through an angle (as illustrated by the block arrow in FIG. 1) by a drive mechanism 65 to facilitate the loading and unloading of cassettes 37 into and out of the cassette holder system 27.

Each cassette 37 holds a number of wafers 35 in individual slots within the cassette as illustrated in FIG. 1. The slots in the cassette are vertically aligned, and the dimensional tolerances of the slot spacing are reasonably small tolerances so that in calibrating the expected locations of the individual wafers within a particular cassette 37, it is usually sufficient to know the location of the center of a single cassette in a single slot such as, for example, the top slot.

The wafers 35 are inserted in the cassettes with flats at the back side of the cassette prior to the loading of a cassette 37 into the cassette holder system 27.

Figure 4:
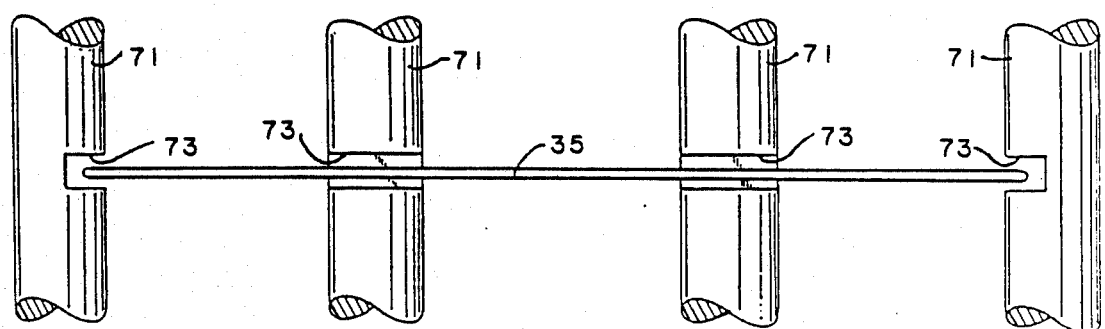
FIG. 4 is an enlarged view taken generally along the line and in the direction indicated by the arrows 4—4 in FIG. 3.

The quartz boat 39 has four quartz rods 71 as illustrated. Other quartz boats may have more than four rods. As best shown in FIG. 4 each rod 71 is formed with a number of vertically spaced slots 73 for receiving and holding wafers 35.

In loading a wafer 35 into a slot 73 the wafer should be moved into the slot without any contact between an edge of a wafer 35 and the sides of the slot 73. To do this, a wafer has to be at the right height Z, it has to be inserted the proper radial distance R, and the actual center of the wafer 35 on the paddle 33 has to be substantially linearly aligned with the desired center of the wafer as loaded in the boat and in the direction of radial movement R of the paddle 33.

Once the wafer 35 has been inserted in a related slot 33, it is lowered gently until the lower surfaces of the slot engage and support the underside of the wafer 35.

The vertical alignment of the slots 73 in the boat 39 and the spacing between the slots are held to relatively small tolerances. Individual boats can, however, exhibit some variation in slot locations, the location of a boat on a pedestal or on the turntable can vary as boats are installed or replaced, and a boat can be subjected to some warpage because of the heating and cooling cycles it undergoes; so in the calibration of the location of the slots 73, it is desirable to calibrate the location of the top slot, a slot near the middle of the boat, and the bottom slot.

Figure 3:
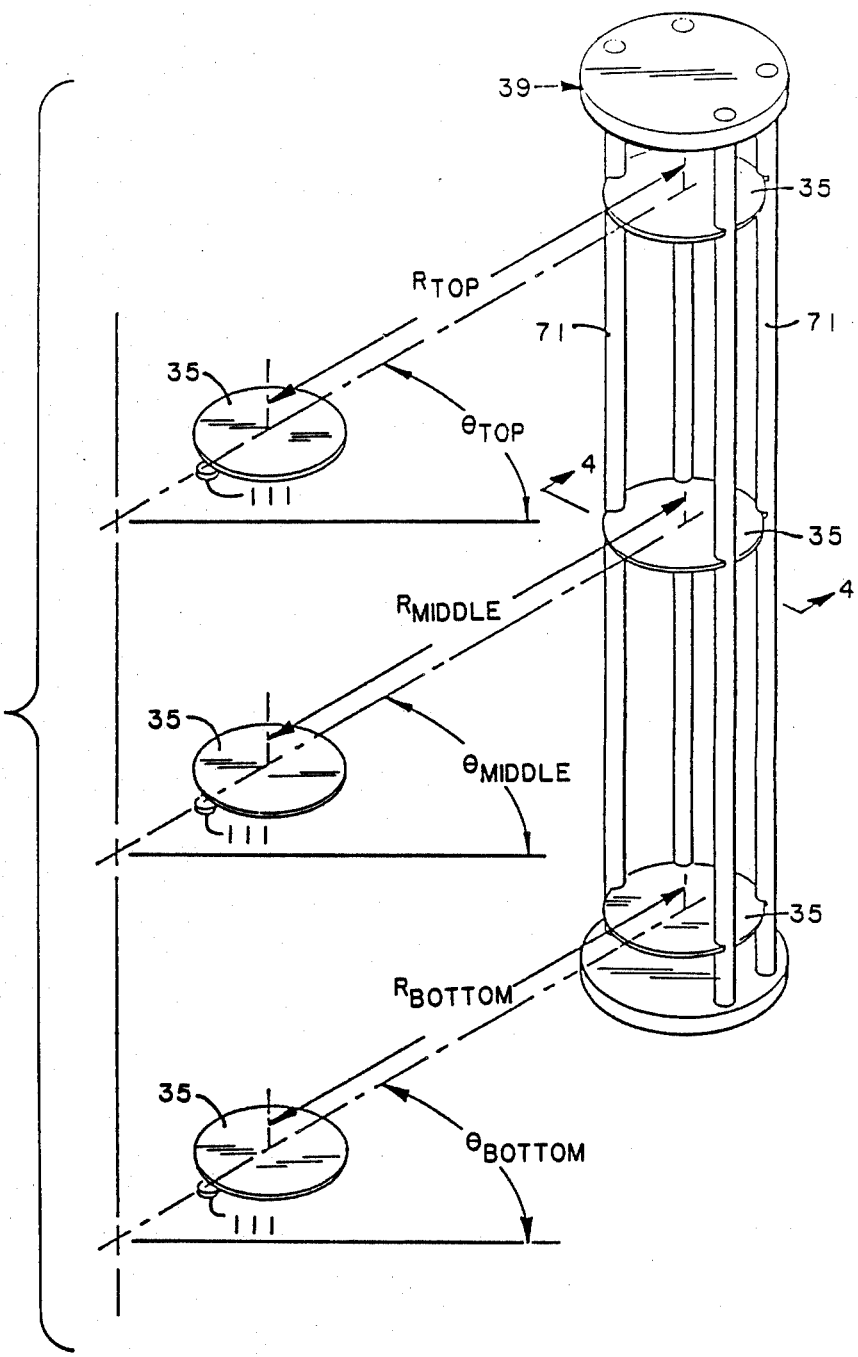
FIG. 3 is an isometric view showing details of how wafers are inserted into and removed from slots in a boat during a calibration of a boat used in the furnace system of FIG. 1.

FIG. 3 illustrates the steps involved in calibrating the locations of the centers of wafers in the top, middle and bottom slots of a boat 39. The locations of the other slots in the boat are then determined by interpolation.

The construction and mode of operation of the wafer transfer module mechanism 29 will now be described with particular reference to FIG. 2.

A vacuum line 81 is connected to the paddle 33 and to ports 83 in the upper surface of the paddle 33 so that the wafer 35 is held securely on the paddle 33 by the suction produced at the ports 83 when the paddle 33 engages the undersurface of a wafer. The point at which this suction is exerted also gives an indication of the vertical position of a wafer at a particular location, and this information is supplied to the controller 31 as the vertical sensor information indicated by the corresponding legend in FIG. 1. In the controller a selected increment is usually added to this signal information to produce a reference for the vertical level to be used when inserting a wafer back into this location, so as to provide adequate bottom and top clearance for the wafer with respect to the slot structure.

The radial movement of the paddle 33 along a rail 84 is produced by an R drive motor 85 and a related drive belt 87. The motor 85 is mounted on a support plate 89.

The support plate 89 is rotatable on an axis 92 in the theta direction (as indicated by the block arrows in FIG. 2) by a shaft 91. The shaft 91 is connected at its top end to the plate 89 and is mounted for rotation within a tube 93 by means of bearings at the top and bottom of the tube 93. One set of bearings 95 is shown in the broken away part at the lower end of the tube 93 in FIG. 2.

The shaft 91 is rotated by a theta drive motor 97 and related pulleys and drive belts as shown in FIG. 2.

The support tube 93 is in turn connected to a lift arm 101 which slides on a rail 103 and which is driven in upward and downward directions by a drive screw 105. The drive screw 105 is rotated by a Z drive motor 107 and a pulley and belt arrangement as shown in FIG. 2.

In a specific embodiment of the present invention the Z drive motor 107, the theta drive motor 97 and the R drive motor 85 are stepper motors.

It is an important feature of the present invention that the paddle 33 and an associated wafer 35 are moved in all three coordinate directions in the system 21 without any edge contact of the wafer with a related boat or cassette.

The present invention accomplishes this by the use of sensors which are first used to calibrate the expected center of a wafer in each source and which then determine the actual center of a wafer on the paddle 33 in the course of each wafer transfer.

It is a particularly important feature of the present invention that any lateral offset of the center of a wafer on the paddle with respect to the center of the paddle is measured and is then used to reposition the paddle 33 to effectively eliminate the offset. The paddle 33 can then insert the wafer 35 into a destination (a slot in a boat or a cassette) with the actual center of the wafer on the true center location required for subsequent transfer of the wafer to the destination. Any error introduced during wafer pick-up is eliminated, and the system conserves all the available tolerances for the very critical wafer delivery.

As illustrated in FIGS. 1, 2 and 3, the wafer transfer module mechanism 29 includes an R sensor 111 mounted on the support plate 89 in a position such that the sensor 111 is actuated whenever the paddle 83 moves the back edge of a wafer 35 over and above the vertical line of sight of the R sensor 111. This R sensor thus enables the radial distance of the center of a wafer in either a slot in the boat or on a slot in a cassette to be determined with respect to the vertical axis of the support tube 93 and the related rotatable shaft 91. When this distance is known, the controller 31 can then control the R drive motor 85 to move the wafer this radial distance in inserting a wafer into or retracting a wafer from the related slot.

As illustrated in FIG. 1, FIG. 2, FIGS. 5A–5C and FIGS. 6A–6C, the mechanism 29 includes a theta sensor 113.

Figure 5A:
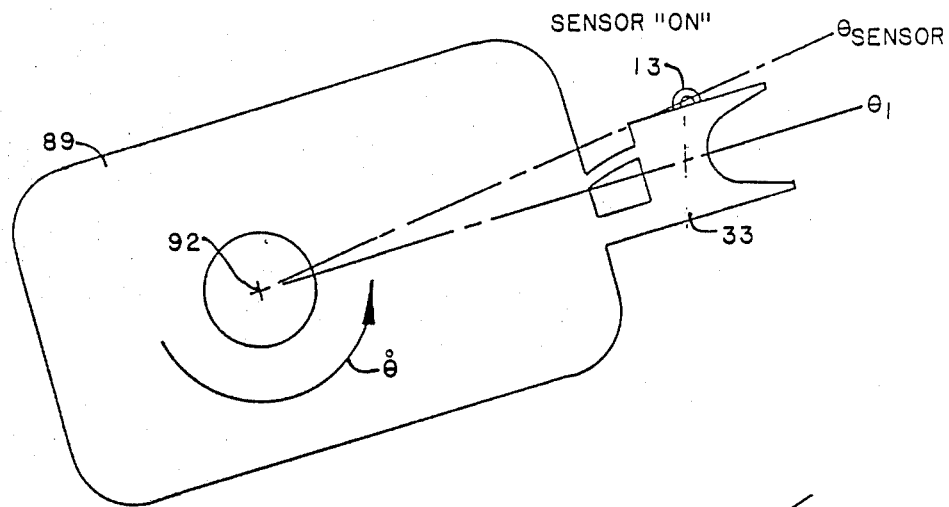
FIGS. 5A through 5C are enlarged, fragmentary plan views showing how a paddle of the wafer transfer module mechanism of FIG. 1 is moved in an arc above a theta sensor in the course of calibrating the center of the paddle.
Figure 5B:
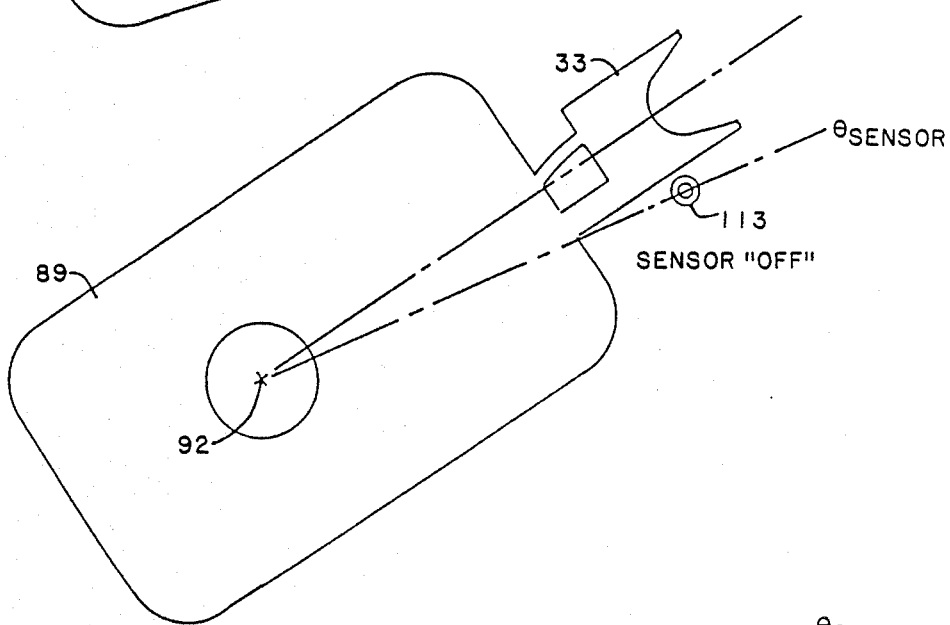
Figure 5C:
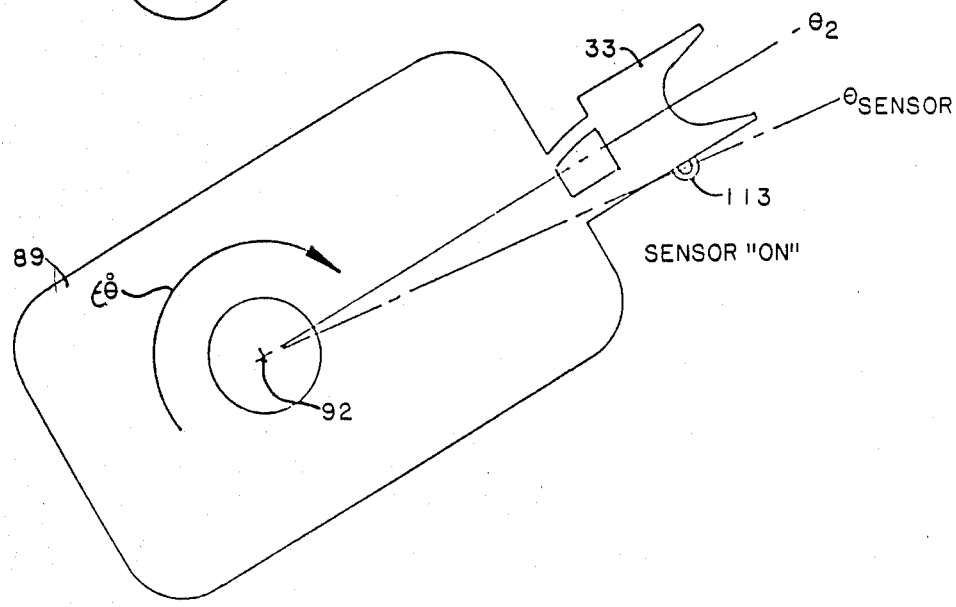
Figure 6A:
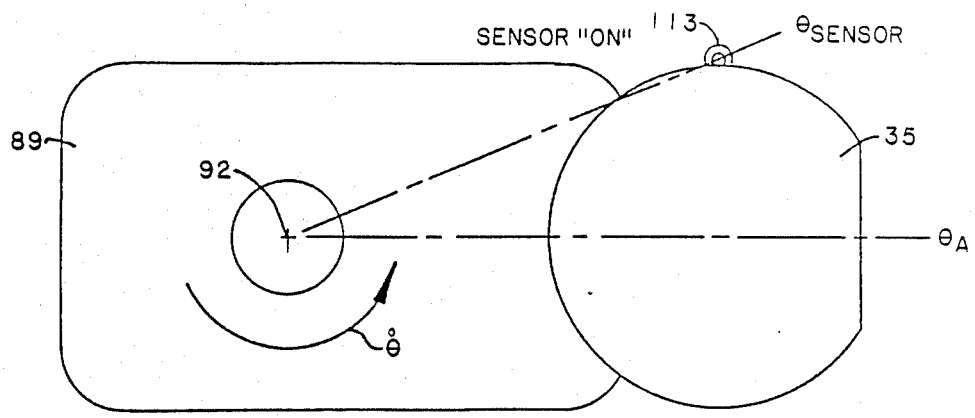
FIGS. 6A through 6C are enlarged, fragmentary plan views (corresponding to FIGS. 5A through 5C) but showing how the theta sensor is used to find the actual center of a wafer carried on a paddle. Any lateral offset of the center of the paddle with respect to the center of the wafer is then compensated and eliminated by the wafer transfer module mechanism shown in FIG. 1.
Figure 6B:
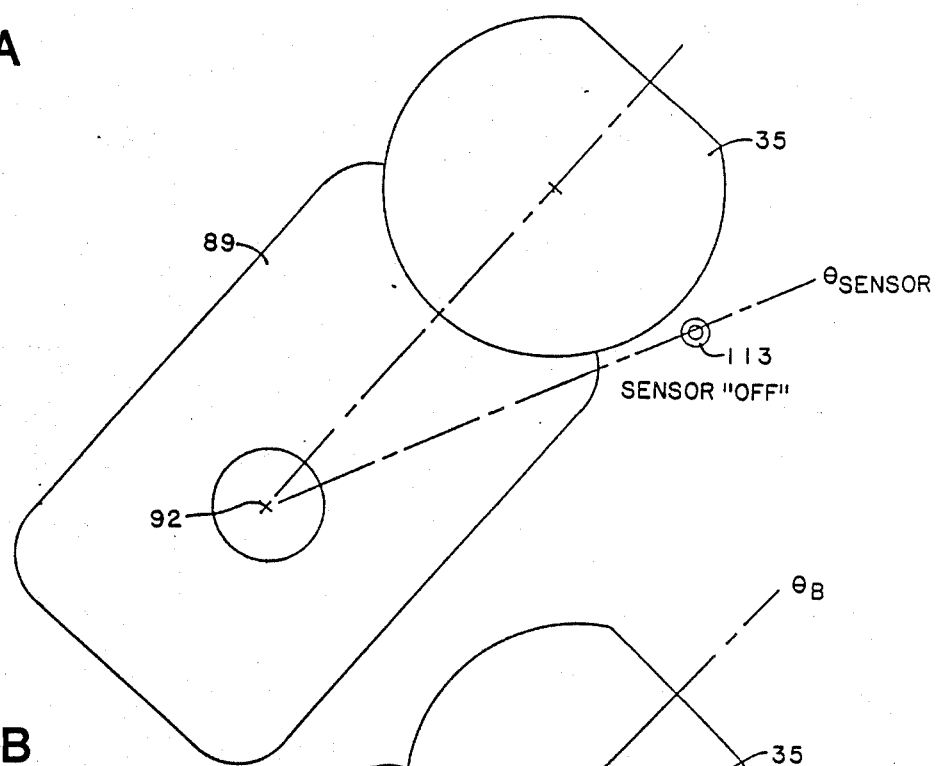
Figure 6C:
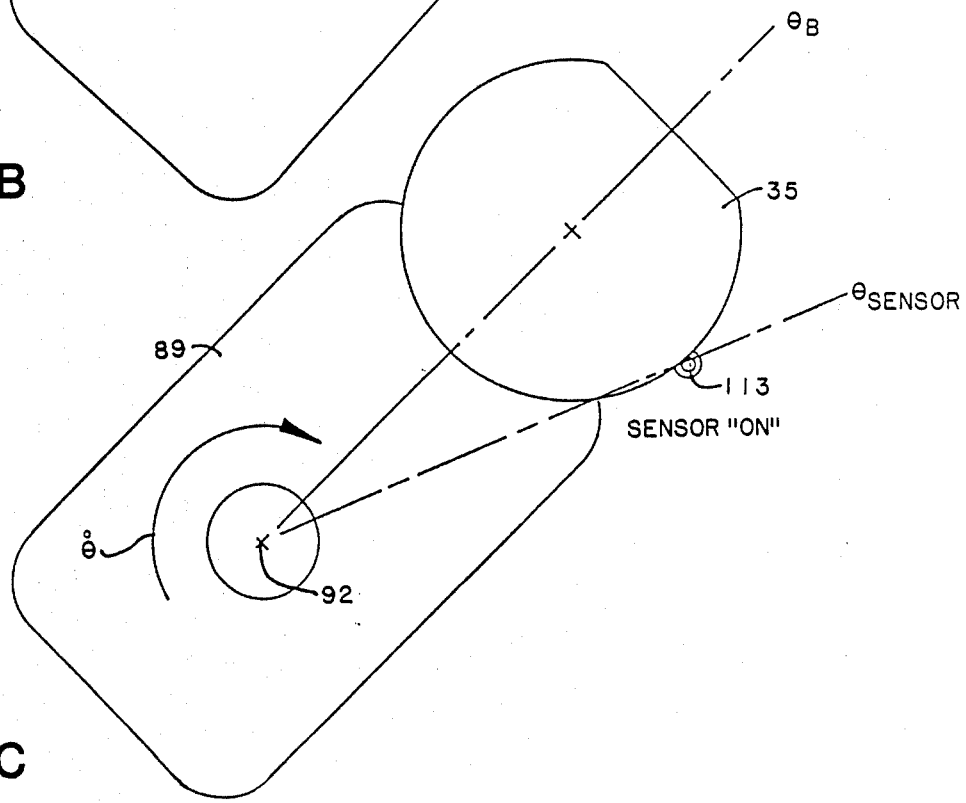

The theta sensor is mounted at a fixed position such that it can be used to detect both the side edges of the paddle 33 (see FIGS. 5A–5C) and the side edges of a wafer 35 carried on the paddle 33 (see FIGS. 6A–6C).

As illustrated in FIG. 2, the theta sensor 113 can be mounted on an arm 115 connected to the support tube 93.

During calibration the theta sensor is used (as illustrated in FIGS. 5A–5C) to calibrate the line of center of the paddle 33 with respect to the axis of rotation 92 of the paddle 33 in the theta direction.

As illustrated in FIG. 5A when the paddle is rotated in a counter clockwise direction and the left hand edge of the paddle 33 passes over the sensor 113, this location of this edge of the paddle is detected by the sensor 113.

As illustrated in FIG. 5C when the paddle 33 is rotated in a clockwise direction and the right hand edge of the paddle 33 passes over the sensor 113, this location of this edge of the paddle is detected by the sensor 113.

The side edge locations of the paddle are expressed as angles $theta_1$ and $theta_2$ respectively (as illustrated in the drawings), and the location of the line of center of the paddle 33 is therefore halfway between the angles $theta_1$ and $theta_2$.

It would, of course, be desirable if the paddle 33 picked up each wafer with the actual center of the wafer completely aligned with the line of center of the wafer paddle as determined above with reference to FIGS. 5A–5C. However, in actual practice, the center of the wafer will probably be laterally offset from the line of center of the paddle 33, and this amount of lateral offset can be enough to cause problems of the wafer edge hitting one or more of the slot surfaces with enough force to cause chipping or flaking of the particulate material. The lateral offset must therefore be measured and must be compensated for in order to avoid such contact. The measurement and compensation for lateral offset of the actual wafer center with respect to the paddle center is also of concern when wafers are transferred from the boat to the cassette. The present invention also compensates for offset in this transfer operation.

The lateral offset is determined twice.

The first determination is made prior to operation in the course of calibrating the expected location of a wafer in a cassette (usually just the top slot, as noted above) and the expected location of wafers in the top, bottom and middle slots of a boat (as noted above).

The second determination of lateral offset is made during operation in conjunction with each transfer of each wafer from a source to a destination.

With reference to FIGS. 6A through 6C, the paddle is first of all rotated in a counter clockwise theta direction (as illustrated in FIG. 6A) until the theta sensor 113 senses the left hand side edge of the wafer 35. At this point the angle $theta_A$ is indicated by the sensor.

The paddle 33 is then rotated in a clockwise direction (as indicated in FIG. 6C) to sense the right hand side edge of the wafer 35, and the angle $theta_B$ is determined.

The actual center of the wafer is then halfway between the two sensed angles. If the angle of this line of center of the wafer differs from the previously calculated angle of the line of center of paddle 33, the controller 31 then rotates the paddle 33 in the proper angular direction to eliminate the lateral offset between the center of the paddle and the center of the wafer carried on the paddle so that the wafer 35 can then be delivered to the related slot in the boat 39 or a cassette 37 without any edge contact.

In summary, an initial calibration is made for each cassette and each boat to determine the expected location of the center of each wafer in a related slot in the cassette or boat. In calibrating a cassette it is usually sufficient to calibrate just the location of a center of a wafer in the top slot of a cassette. In calibrating the boat, it is, as noted above, generally desirable to calibrate the top slot, a middle slot, and the bottom slot of the boat (as illustrated in FIG. 3).

The theta sensor 113 is then used to detect and to measure any lateral offset of the actual center of a wafer on the paddle 33 from the calibrated center, and the theta drive unit is driven in the proper direction to compensate for such lateral offset before the wafer 35 is inserted into a related slot in the boat or cassette.

While we have illustrated and described the preferred embodiments of our invention, it is to be understood that these are capable of variation and modification, and we therefore do not wish to be limited to the precise details set forth, but desire to avail ourselves of such changes and alterations as fall within the purview of the following claims.

I claim:

1. A furnace for heating and/or processing wafers and comprising, a vertical processing chamber, a boat constructed to hold a number of wafers to be processed in the chamber and shaped to be inserted into and withdrawn from the vertical processing chamber through a lower end of the chamber, elevator means for raising a boat loaded with wafers into the chamber from a chamber loading/unloading station and for lowering a boat loaded with wafers out of the chamber back to the chamber loading/unloading station, said elevator means and boat structure being separate and independent of each other so that a boat with its load of wafers can, as a unit, be placed onto and taken off of the elevator means at the chamber loading/unloading station, and boat exchange means for transferring a boat loaded with wafers between the chamber loading/unloading station and a wafer loading/unloading station, said boat exchange means comprising a rotatable turntable contructed to support one boat at one location and to support another boat at a different location on the turntable so that one boat can be undergoing a loading/unloading operation of wafers in the boat at the wafer loading/unloading operation while the other boat loaded with wafers can be undergoing a related loading/unloading operation of the boat and wafers into or out of the chamber at the chamber loading/unloading station, said boat exchange means including rotating means for rotating the turntable to transfer boats loaded with wafers between the chamber loading/unloading station and the wafer loading/unloading station.

2. A wafer transfer mechanism for transferring a wafer from a source to a destination while compensating for any lateral offset of the actual location of the wafer center from the expected location of the wafer center in the source so that the wafer can be placed in the destination with the actual location of the wafer center very near a predetermined, desired, lateral location of the wafer center in the destination, said mechanism comprising, a wafer transfer module which includes a paddle which is movable vertically, radially and in a circular arc in the course of picking up a wafer from the source and transferring the wafer to the destination, and sensor means for finding and measuring the amount of any lateral offset of the paddle center with respect to the wafer center after the wafer has been picked up and withdrawn from the source by the paddle, and control means for repositioning the paddle laterally by the amount of the measured offset before delivering the wafer to the destination by the paddle.

3. The invention claimed in claim 2 wherein the source is a slot in a cassette and the destination is a slot in a boat which is to be loaded in a heating and/or processing chamber of a furnace.

4. The invention claimed in claim 2 wherein the source is a slot in a boat of the kind which is loaded in a heating and/or processing chamber of a furnace and wherein the destination is a slot in a cassette.

5. The invention defined in claim 2 including calibration means for finding said expected source location and said desired destination location by a calibration performed prior to said removing step.

6. The invention defined in claim 2 wherein the sensor means find said amount of offset by looking at two opposite edges of the wafer.

7. The invention defined in claim 6 wherein said sensor means include a fixed sensor and wherein the edges of the wafer are moved over the sensor to determine said two opposite edges of the wafer.

8. A method of transferring a wafer from a source to a destination and compensating for any lateral offset of the actual location of the wafer center from the expected location of the wafer center in the source so that the wafer can be placed in the destination with the actual location of the wafer center very near a predetermined, desired, lateral location of the wafer center in the destination, said method comprising, removing the wafer from the source by a paddle having a center location which is known with respect to both said expected source location and said desired destination location, finding the amount of any lateral offset of the paddle center with respect to the wafer center, repositioning the paddle laterally by that amount of offset, and then delivering the wafer to the destination by the paddle.

9. The invention claimed in claim 8 wherein the source is a slot in a cassette and the destination is a slot in a boat which is to be loaded in a heating and/or processing chamber of a furnace.

10. The invention claimed in claim 8 wherein the source is a slot in a boat of the kind which is loaded in a heating and/or processing chamber of a furnace and wherein the destination is a slot in a cassette.

11. The invention defined in claim 8 including finding said expected source location and said desired destination location by a calibration performed prior to said removing step.

12. The invention defined in claim 8 including finding said amount of offset by looking at two opposite edges of the wafer.

13. The invention defined in claim 12 including using a fixed sensor and swinging the edges of the wafer over the sensor to determine said two opposite edges of the wafer.

14. A furnace for heating and/or processing wafers and comprising, a cassette having slots for holding wafers within the cassette, a boat having slots for holding wafers to be heated when the boat is loaded in a heating chamber, boat holder means for holding the boat at a wafer loading/unloading station while wafers are transferred between the slots of a cassette and the slots of a boat, wafer transfer means for transferring wafers between the slots of a cassette and the slots of a boat, vertical chamber means having an open lower end through which the boat is inserted at the beginning of a heating and/or processing cycle and withdrawn at the end of the cycle, and elevator means for raising the boat into the vertical chamber means from a chamber loading/unloading station and for lowering the boat out of the heating chamber means back to the chamber loading/unloading station, said elevator means and boat structure being separate and independent of each other so that a boat with its load of wafers can, as a unit, be placed onto and taken off of the elevator means at the chamber loading/unloading station and a boat can be loaded with wafers prior to the time the boat is placed on the elevator means and wafers can be unloaded from a boat after the boat is removed from the elevator means whereby the processing of wafers in the furnace is not delayed by the time required to load or to unload wafers from a boat.

15. The invention defined in claim 14 wherein the elevator means pick up and return a boat at a chamber loading/unloading station which is at a location different from the location of the wafer loading/unloading station and wherein the boat holder means include a rotatable turntable which rotates to transfer a boat between the chamber loading/unloading station and the wafer loading/unloading station.

16. The invention defined in claim 14 wherein the boat slots are vertically spaced apart and are substantially vertically aligned with one another and wherein the cassette slots are vertically spaced apart and substantially vertically aligned with one another and wherein the wafer transfer means include a paddle which is movable vertically to pick up and to carry a wafer during a transfer of the wafer between the boat and cassette and which is movable radially into and out of the cassette and the boat and which is also movable in a circular arc in the course of making a transfer between a cassette and a boat.

17. The invention defined in claim 16 including radial sensor means for sensing the amount of radial movement of the paddle which is involved in withdrawing a wafer from a cassette or boat.

18. The invention defined in claim 16 including vertical sensor means for sensing the vertical position of a wafer in a slot of a boat or a cassette.

19. The invention defined in claim 16 including theta sensor means for sensing and measuring the amount of offset of the center of the paddle with respect to the center of a wafer carried on the paddle.

20. The invention defined in claim 16 including vertical, radial and rotational motor drive means for moving the paddle in respective vertical, radial and rotational directions and including controller means for controlling the actuation of the vertical, radial and rotational motor means.

21. A furnace for heating and/or processing wafers and comprising, a cassette having slots for holding wafers within the cassette, a boat having slots for holding wafers to be heated when the boat is loaded in a heating chamber, boat holder means for holding the boat at a wafer loading/unloading station while wafers are transferred between the slots of a cassette and the slots of a boat, wafer transfer means for transferring wafers between the slots of a cassette and the slots of a boat, vertical chamber means having an open lower end through which the boat is inserted at the beginning of a heating and/or processing cycle and withdrawn at the end of the cycle, elevator means for raising the boat into the vertical chamber means from a chamber loading/unloading station and for lowering the boat out of the heating chamber means back to the chamber loading/unloading station, wherein the boat slots are vertically spaced apart and are substantially vertically aligned with one another and wherein the cassette slots are vertically spaced apart and substantially vertically aligned with one another and wherein the wafer transfer means include a paddle which is movable vertically to pick up and to carry a wafer during a transfer of the wafer between the boat and cassette and which is movable radially into and out of the cassette and the boat and which is also movable in a circular arc in the course of making a transfer between a cassette and a boat, vertical, radial and rotational motor drive means for moving the paddle in respective vertical, radial and rotational directions and including controller means for controlling the actuation of the vertical, radial and rotational motor means, radial sensor means for sensing the amount of radial movement of the paddle which is involved in withdrawing a wafer from a cassette or boat, vertical sensor means for sensing the vertical position of a wafer in a slot in a boat or in a shelf of a cassette, theta sensor means for sensing and measuring the amount of offset of the center of the paddle with respect to the center of a wafer on the paddle, and wherein the sensor means send signals to the controller means for establishing in three coordinates by calibration the expected center of a wafer in each shelf and in each slot and for also compensating during the actual transfer for any lateral offset of the paddle center with respect to the wafer center by repositioning the paddle laterally by that amount of offset required so that any errors introduced during wafer pick-up are eliminated and the wafer transfer means conserve all of the available tolerances for the very critical wafer delivery.

* * * * *

(12) EX PARTE REEXAMINATION CERTIFICATE (5252nd)
United States Patent
Hugues et al.

(10) Number: US 4,770,590 C1
(45) Certificate Issued: Jan. 10, 2006

(54) METHOD AND APPARATUS FOR TRANSFERRING WAFERS BETWEEN CASSETTES AND A BOAT

(75) Inventors: Jean B. Hugues, Tempe, AZ (US); Lynn Weber, Saratoga, CA (US); James E. Herlinger, Palo Alto, CA (US); Katsuhito Nishikawa, San Jose, CA (US); Donald L. Schuman, Saratoga, CA (US); Gary W. Yee, Santa Clara, CA (US)

(73) Assignee: Silicon Valley Group, Inc., San Jose, CA (US)

Reexamination Request:
No. 90/006,018, May 25, 2001

Reexamination Certificate for:
Patent No.: 4,770,590
Issued: Sep. 13, 1988
Appl. No.: 06/864,077
Filed: May 16, 1986

(51) Int. Cl.
*B65G 25/00* (2006.01)

(52) U.S. Cl. .................. 414/172; 198/395; 198/464.3; 250/559.3; 250/559.33; 414/744.3; 414/804; 414/937; 414/936; 414/789.9; 29/407.04; 29/759; 901/47; 901/17

(58) Field of Classification Search ............ 414/172, 414/804; 250/559.3, 559.33; 432/241; 700/59, 700/121
See application file for complete search history.

(56) References Cited

U.S. PATENT DOCUMENTS 1,617,056 A * 2/1927 Kenworthy ............... 432/241

3,749,383 A   7/1973 Voight et al. ............... 266/5 A
4,550,242 A * 10/1985 Uehara et al. ........ 219/121.43

FOREIGN PATENT DOCUMENTS

| JP | 58-75840 | 5/1983 |
| JP | 59-39341 | 3/1984 |
| JP | 60-257121 | 12/1985 |
| JP | 60-258459 | 12/1985 |
| JP | 61-206741 | 9/1986 |
| JP | 61-291335 | 12/1986 |

OTHER PUBLICATIONS

Japanese Article "Electrical Material (Denshi Zairyon)" pp. 114–118, Mar. 1986 (partial translation provided).

* cited by examiner

*Primary Examiner*—Eileen D Lillis

(57) ABSTRACT

A wafer transfer mechanism used for transferring wafers between cassettes and a boat uses sensors to detect and to measure any offset of the actual center of each wafer being transferred with respect to the expected or precalibrated center of that wafer. An appropriate adjustment is made to effectively eliminate such offset so that each wafer can be transferred throughout the system without any edge contact between a wafer and the boat or the cassette. The system also includes a boat exchange unit having a rotatable turntable which is used in association with two boats. The boat exchange unit permits a continuous mode operation in which one boat can be undergoing a loading or unloading of wafers at one station on the turntable while another boat is at or is moving to or from a heating chamber loading or unloading station on the turntable.

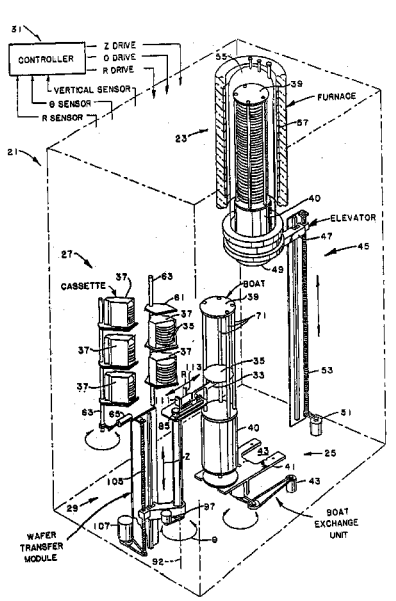

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2–13 and 21 is confirmed.

Claim 14 is cancelled.

Claims 1, 15 and 16 are determined to be patentable as amended.

Claims 17–20, dependent on an amended claim, are determined to be patentable.

1. A furnace for heating and/or processor wafers and comprising, a vertical processing chamber, a boat constructed to hold a number of wafers to be processed in the chamber and shaped to be inserted into and withdrawn from the vertical processing chamber through a lower end of the chamber, elevator means for raising a boat loaded with wafers into the chamber from a chamber loading/unloading station and for lowering a boat loaded with wafers out of the chamber back to the chamber loading/unloading station, said elevator means and boat structure being separate and independent of each other so that a boat with its load of wafers can, as a unit, be placed onto and taken off of the elevator means at the chamber loading/unloading station, and boat exchange means for transferring a boat loaded with wafers between the chamber loading/unloading station and a wafer loading/unloading station *by rotation*, said boat exchange means comprising a rotatable turntable contructed to support one boat at one location and to support another boat at a different location on the turntable so that one boat can be undergoing a loading/unloading operation of wafers in the boat at the wafer loading/unloading operation while the other boat loaded with wafers can be undergoing a related loading/unloading operation of the boat and wafers into or out of the chamber at the chamber loading/unloading station, said boat exchange means including rotating means for rotating the turntable to transfer boats loaded with wafers between the chamber loading/unloading station and the wafer loading/unloading station.

15. [The invention defined in claim 14] *A furnace for heating and/or processing wafers and comprising,*

*a cassette having slots for holding wafers within the cassette,*

*a boat having slots for holding wafers to be heated when the boat is loaded in a heating chamber,*

*boat holder means for holding the boat at a wafer loading/unloading station while wafers are transferred between the slots of a cassette and the slots of a boat,*

*wafer transfer means for transferring wafers between the slots of a cassette and the slots of a boat,*

*vertical chamber means having an open lower end through which the boat is inserted at the beginning of a heating and/or processing cycle and withdrawn at the end of the cycle,*

*elevator means for raising the boat into the vertical chamber means from a chamber loading/unloading station and for lowering the boat out of the heating chamber means back to the chamber loading/unloading station,*

*said elevator means and boat structure being separate and independent of each other so that a boat with its load of wafers can, as a unit, be placed onto and taken off of the elevator means at the chamber loading/unloading station and a boat can be loaded with wafers prior to the time the boat is placed on the elevator means and wafers can be unloaded from a boat after the boat is removed from the elevator means whereby the processing of wafers in the furnace is not delayed by the time required to load or to unload wafers from a boat, and*

*wherein the elevator means pick up and return a boat at a chamber loading/unloading station which is at a location different from the location of the wafer loading/unloading station and wherein the boat holder means include a rotatable turntable which rotates to transfer a boat between the chamber loading/unloading station and the wafer loading/unloading station.*

16. The invention defined in claim [14] *15* wherein the boat slots are vertically spaced apart and are substantially vertically aligned with one another and wherein the cassette slots are vertically spaced apart and substantially vertically aligned with one another and wherein the wafer transfer means include a paddle which is movable vertically to pick up and to carry a wafer during a transfer of the wafer between the boat and cassette and which is movable radially into and out of the cassette and the boat and which is also movable in a circular arc in the course of making a transfer between a cassette and a boat.

* * * * *